United States Patent [19]

Koshiba et al.

[11] Patent Number: 4,957,588
[45] Date of Patent: Sep. 18, 1990

[54] METHOD FOR HIGH TEMPERATURE REACTION PROCESS

[75] Inventors: Mitsunobu Koshiba, Shinyoshida; Yoshiyuki Harita, Shirahatadai; Yuuji Furuto, Nittamae, all of Japan; Bruno Roland, Waverse Baan; Ria Lombaerts, Kapellelei, both of Belgium

[73] Assignees: Japan Synthetic Rubber Co., Ltd., Tokyo, Japan; UCB Societe Anonyme, Brussels, Belgium

[21] Appl. No.: 437,518

[22] Filed: Nov. 16, 1989

[30] Foreign Application Priority Data

Nov. 22, 1988 [JP] Japan ................................. 63-293633

[51] Int. Cl.⁵ ..................... B44C 1/22; C03C 15/00; C03C 25/06; B29C 37/00
[52] U.S. Cl. .................................... 156/628; 156/643; 156/646; 156/655; 156/668; 156/345; 204/192.36

[58] Field of Search ............... 156/628, 635, 643, 646, 156/655, 659.1, 668, 345; 430/298, 317, 327, 328, 967; 427/38, 39, 43.1; 204/192.32, 192.36

[56] References Cited

U.S. PATENT DOCUMENTS

| | | | |
|---|---|---|---|
| 4,613,398 | 9/1986 | Chiong et al. | 156/628 |
| 4,615,765 | 10/1986 | Levinson et al. | 156/643 |
| 4,657,845 | 4/1987 | Frechet et al. | 430/326 |
| 4,751,170 | 6/1988 | Mimura et al. | 156/628 X |
| 4,867,838 | 9/1989 | Brooks et al. | 156/628 |

Primary Examiner—William A. Powell
Attorney, Agent, or Firm—Oliff & Berridge

[57] ABSTRACT

A method for high temperature reaction process, including the steps of mounting a substrate on which a radiation-sensitive polymer film is formed on a lower heating plate in a reaction vessel, sealing the reaction vessel while positioning an upper heating plate to above the substrate, maintaining a temperature difference between temperatures of the lower heating plate and the upper heating plate within a predetermined range, and supplying a reactive compound into the reaction vessel.

13 Claims, 3 Drawing Sheets

METHOD FOR HIGH TEMPERATURE REACTION PROCESS

BACKGROUND OF THE INVENTION

1. Field of the Invention

The present invention relates to a method for high temperature reaction process, and more particularly to a method for high temperature reaction process suitable for utilization in the treatment of a radiation-sensitive resin layer with a silicon compound or an amine compound.

2. Description of the Prior Art

Conventionally, in the production of semiconductor elements such as ICs and LSIs, so-called photolithography is adopted wherein a negative-type radiation-sensitive resin in which a bisazide compound is mixed into cyclized polyisoprene or cyclized polybutadiene, or a positive-type radiation-sensitive compound in which a quinone diazide compound is mixed into a novolak resin is applied as a resist to the surface of a substrate which is to be processed and is irradiated patternwise by the g-rays (436 nm wavelength) or i-rays (365 nm wavelength) from a mercury lamp, and developed by a developing solution.

However, in recent years LSIs have become even more miniaturized, and the minimum dimension of the circuit patterns to be formed on the substrate is in the region of at 1 $\mu$m or less. With dimensions in this area, even if the photolithography method is used, especially in the case where a topographic substrate having a stepping structure is used, the drawback arises that adequate resolution cannot be obtained because of the effect of the reflection of the light during irradiation and the shallow focus depth of the irradiation system.

In order to solve this type of problem, in the European Patent Laid-open No. 184567 and the U.S. Pat. No. 4613398, methods are proposed wherein after exposure of a circuit pattern by using the g- or i-rays of a mercury lamp or deep ultraviolet rays in the same way as in the conventional photolithography, selective silylation of a radiated or an irradiated section by treatment with a silicon compound, for example, is performed, followed by development by means of an isotropic etching using plasma.

SUMMARY OF THE INVENTION

It is an object of the present invention to provide, with due consideration to the drawbacks of such conventional methods, a method for high temperature reaction process which can suitably carry out the process of treatment with a silicon compound proposed in the European Patent Laid-open No. 184567 and the U.S. Pat. No. 4613398.

It is another object of the present invention to provide a method for high temperature reaction process which can suitably carry out the treatment process with an amino compound in the image reversal process.

According to the present invention there is provided a method for high temperature reaction process for the treatment of a polymer film on a substrate with a reactive compound in a reaction vessel capable of being tightly sealed and equipped with an upper heating plate positioned above the substrate, and a lower heating plate positioned below the substrate, both heating plates being designed to heat said substrate, which comprises the step of maintaining the temperature difference between the temperature TU° C. of the upper heating plate and the temperature TL° C. of the lower heating plate so that TU falls in the range of (TL−30) to (TL−70) °C. during the treatment.

Here, the distance between the upper heating plate and the substrate may be larger than the distance between the lower heating plate and the substrate.

The lower heating plate may be in contact with the substrate.

The distance between the upper heating plate and the substrate may be 10 to 25 mm.

The upper and lower heating plates may be made of any one of aluminum, stainless steel and hastelloy.

The temperature TL° C. of the lower heating plate may be 70° to 250° C.

The temperature TU° C. of the upper heating plate may be 40° to 160° C.

The reactive compound may be introduced into the reaction vessel together with an inert carrier gas heated at 40° C. to 80° C.

The reaction compound may be introduced into the reaction vessel by means of a plurality of small holes.

The polymer film may be a radiation-sensitive regin composite comprising an alkali-soluble resin and a quinone diazide resin.

The reactive compound may be any one of silicon compounds consisting of hexamethyl disilasane, N-trimethylsilylacetamide, N,O-bis(trimethylsilyl)acetoamide, vinyltrichlorosilane, methyltrichlorosilane, phenyltrichlorosilane, and methyltrichlorosilane.

The above and other objects, effects, features and advantages of the present invention will become more apparent from the following description of embodiments thereof taken in conjunction with the accompanying drawings.

DETAILED DESCRIPTION OF PREFERRED EMBODIMENTS

Figure 1:
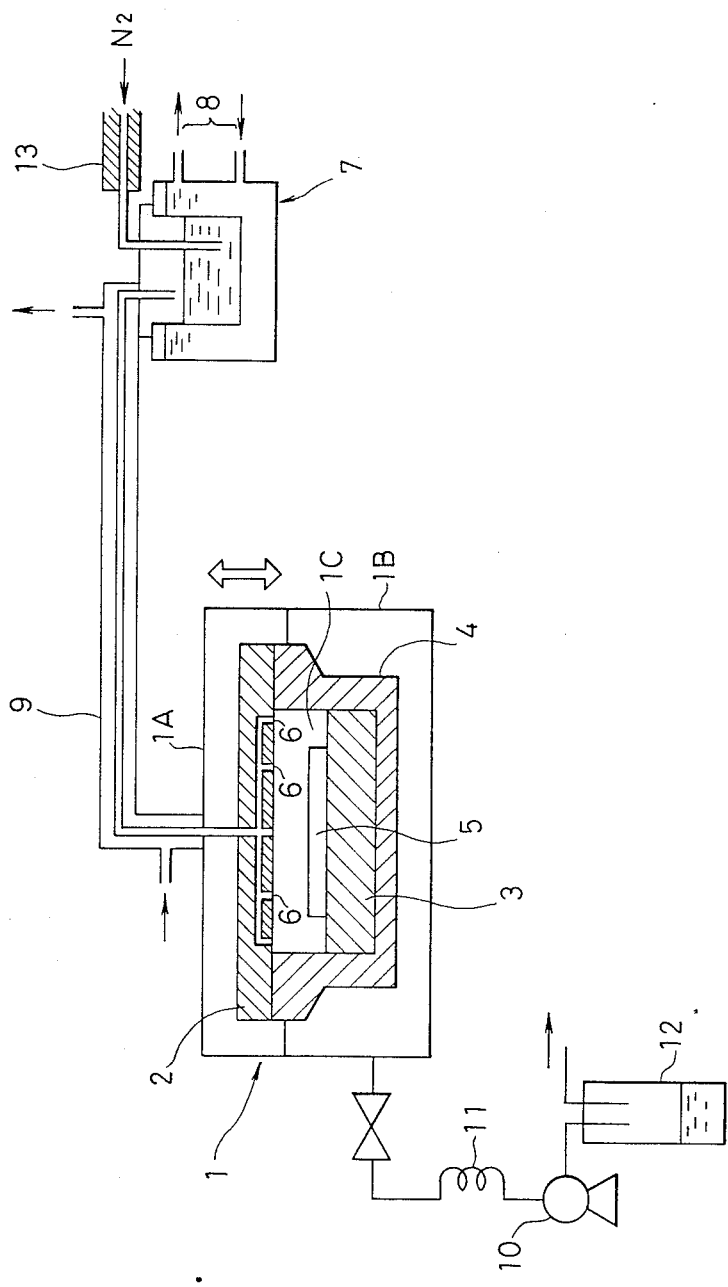
FIG. 1 is a sectional diagram showing an embodiment of a high temperature reaction processing equipment used to carry out the present invention.

There are no particular limitations on equipment used in carrying out the process of the present invention, provided that a reaction vessel is capable of being tightly sealed. However, it is desirable that reduced pressure be used to allow fast injection of a reactive compound into the reaction vessel.

In the equipment used in carrying out the process of the present invention, heating plates are positioned above and below an object substrate to be treated, and it is desirable that the lower heating plate be extremely close to, and the most preferably in contact with the substrate. It is also desirable that the upper heating plate be positioned closely above the substrate, with the preferred distance between the upper heating plate and the substrate being 10 to 25 mm.

In the equipment used in the present invention, materials from which the upper and lower heating plates are formed can be, for example, aluminum, stainless steel, hastelloy, and the like. During the treatment of the substrate, the heating plates are maintained at temperatures indicated below. Specifically, when a temperature of the lower heating plate is TL° C. and a temperature of the upper heating plate is TU° C., it is necessary that TU° C. be maintained between (TL−30) °C. to (TL−70) °C., and preferably between (TL−50) °C. to (TL−70) °C. If TU° C. is lower than (TL−70) °C. or higher than (TL−30) °C., in the case where a resist pattern is to be formed using a radiation-sensitive resin as a polymer film, a resist pattern with designed dimensions cannot be obtained.

It is desirable that heating be maintained to give temperatures of TL=70° to 250° C. and TU=40° to 160° C., and preferably of TL=100° to 180° C. and TU=70° to 110° C.

In the present invention, because it is necessary that a reactive compound uniformly comes into contact with a polymer film on a substrate, it is desirable that the reactive compound be introduced into a reaction vessel through a plurality of holes, preferably small holes. A diameter of these small holes is usually 1 to 2 mm. There are no specific restrictions as to the location where these holes can be positioned, so long as the same can deliver the reactive compound onto the substrate quickly and in a uniform manner. However, it is desirable that they be set on the surface of the upper heating plate opposite to the substrate. Further, in order to ensure uniform distribution and reaction of the reactive compound on the substrate, it is desirable that these holes be arranged to take a radial pattern from the center of the upper heating plate. In addition, it is preferred to increase the inner diameter of the holes or the number of holes at the outer area of the upper heating plate so that a larger volume of the reactive compound may flow in such outer area.

The reactive compound is generally introduced to the reaction vessel in the form of a gas. In this case, the gaseous reactive compound is introduced together with an inert carrier gas such as nitrogen, argon, helium, and the like, heated to 40° to 80° C. and preferably to 40° to 50° C. However, it is also possible to introduce the reactive compound in the form of a liquid, for example, in the form of a mist, into the reaction vessel which has a vacuum, so that the compound is gasified in the reaction vessel. The volume of gas of the reactive compound introduced into the reaction vessel in the case where the volume of the reaction vessel is, for example, 300 to 400 ml, is usually 0.005 to 100 liters per minute, and preferably 0.05 to 50 liters per minute. The duration of contact of the gas of the reactive compound with the polymer film on the substrate is generally 30 seconds to 10 minutes, and preferably 30 seconds to 6 minutes.

The concentration of the gas of the reactive compound in the reaction vessel is generally 1 to 50 vol.% and preferably 1 to 30 vol.%. The total pressure inside the reaction vessel is generally 50 to 900 mmHg and preferably 200 to 760 mmHg.

In the present invention, examples of a substrate with a polymer film suitable for a high temperature reaction treatment which can be given are semiconductor substrates of silicon, gallium arsenide, and the like, glass substrates, diamond substrates, and the like, having a radiation-sensitive resin layer. Examples of the radiation-sensitive resins which can be used here are radiation-sensitive resins comprised of an alkali-soluble resin such as novolak resin, polyhydroxystyrene, or the like, and a quinone diazide compound, a bisazide compound, or the like. Particularly desirable are a condensate of an alkali-soluble resin with a hydroxyl group and a quinone diazide compound, or an alkali-soluble resin having an azide group as a side chain.

Given as examples of reactive compounds to be contacted with the polymer film on the substrate are silicon compounds such as hexamethyl disilasane, N-trimethylsilylacetamide, N,O-bis(trimethylsilyl)acetoamide, vinyltrichlorosilane, methyltrichlorosilane, phenyltrichlorosilane, methylphenyldichlorosilane, and the like.

A detailed and specific explanation will now be given of an embodiment of equipment used to carry out the present invention with reference to the drawings.

FIG. 1 shows an embodiment of equipment for a method for high temperature reaction process. A reaction vessel 1 can be separated into an upper member 1A and a lower member 1B. By moving the lower member 1B upward the reaction vessel 1 can be maintained in a tightly sealed states. In this embodiment, the upper member is secured in an immovable states, but it is also acceptable to make the lower member fixed. An upper heating plate 2, a lower heating plate 3, and a seal member 4 provided on the lower member 1B side of the reaction vessel 1 to maintain the lower heating plate 3 at a high temperature through their contact, are provided. When the reaction vessel 1 is tightly sealed by the upper member 1A and the lower member 1B, the peripheral section of the seal member 4 contacts the upper heating plate 2 to form a reaction chamber 1C between the upper heating plate 2 and the lower heating plate 3.

Figure 2:
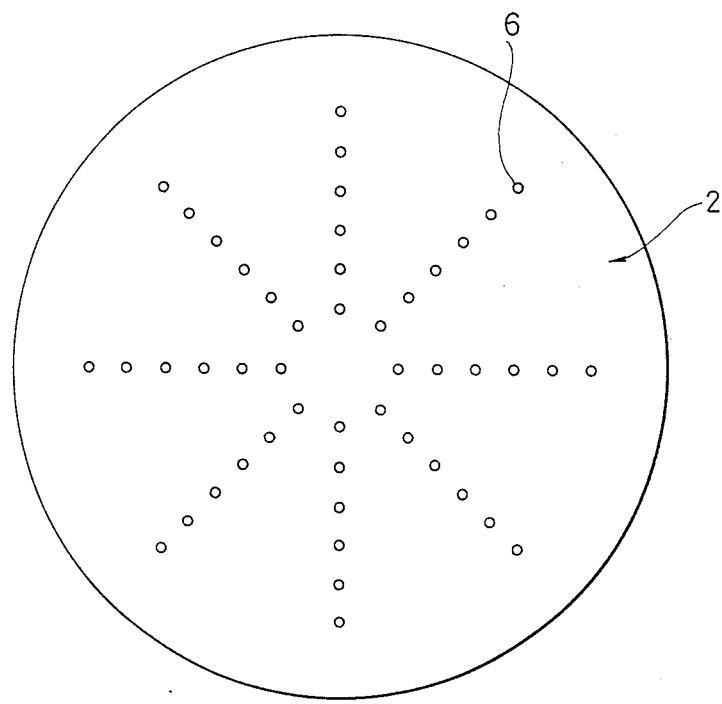
FIG. 2 is a bottom view showing the upper heating plate in FIG. 1.

A substrate 5 is mounted on the lower heating plate 3 and is subjected to the high temperature reaction treatment. Although omitted from the drawing, a radiation-sensitive resin layer on which the irradiation process is implemented is provided on the substrate 5, and when the reaction vessel 1 is maintained in a tightly-sealed state, a suitable gap is maintained between the substrate 5 and the upper heating plate 2, as previously outlined. In addition, a large number of small holes 6 penetrate the surface of the upper heating plate 2 which faces to the substrate 5, as shown in FIG. 2. A reactive compound gas of a silicon compound stored in a bubbler 7, as well as an inert carrier gas heated by a heating device 13 as required, can be supplied to the inside of the reaction vessel 1 through the small holes 6.

A heating device 8 is also provided in the bubbler 7 to control the temperature of the bubbler 7. The concentration of the reactive compound gas which is fed into the reaction vessel 1 together with the inert carrier gas is adjusted by controlling the temperature of the silicon compound. The flow rate of the inert carrier gas is controlled by a flow control equipment such as a mass flow controller or a flowmeter (omitted from the drawings) so that the feed rate of the reactive compound gas can be suitably controlled. A heating device 9 for preventing the reactive compound gas from condensing is also provided.

A vacuum pump 10, a condenser 11, and a reactive compound gas trap 12 are provided, and when the treating is completed, the gas, including the high temperature reactive compound gas, is cooled in the condenser 11, and the condensed reactive compound gas can be recovered from the trap 12 from the vacuum pump 10. In the case where the reaction vessel 1 is separated into the upper and lower parts, it is acceptable to introduce nitrogen gas and the like into the reaction chamber 1C from the small holes 6 and the like.

Figure 3:
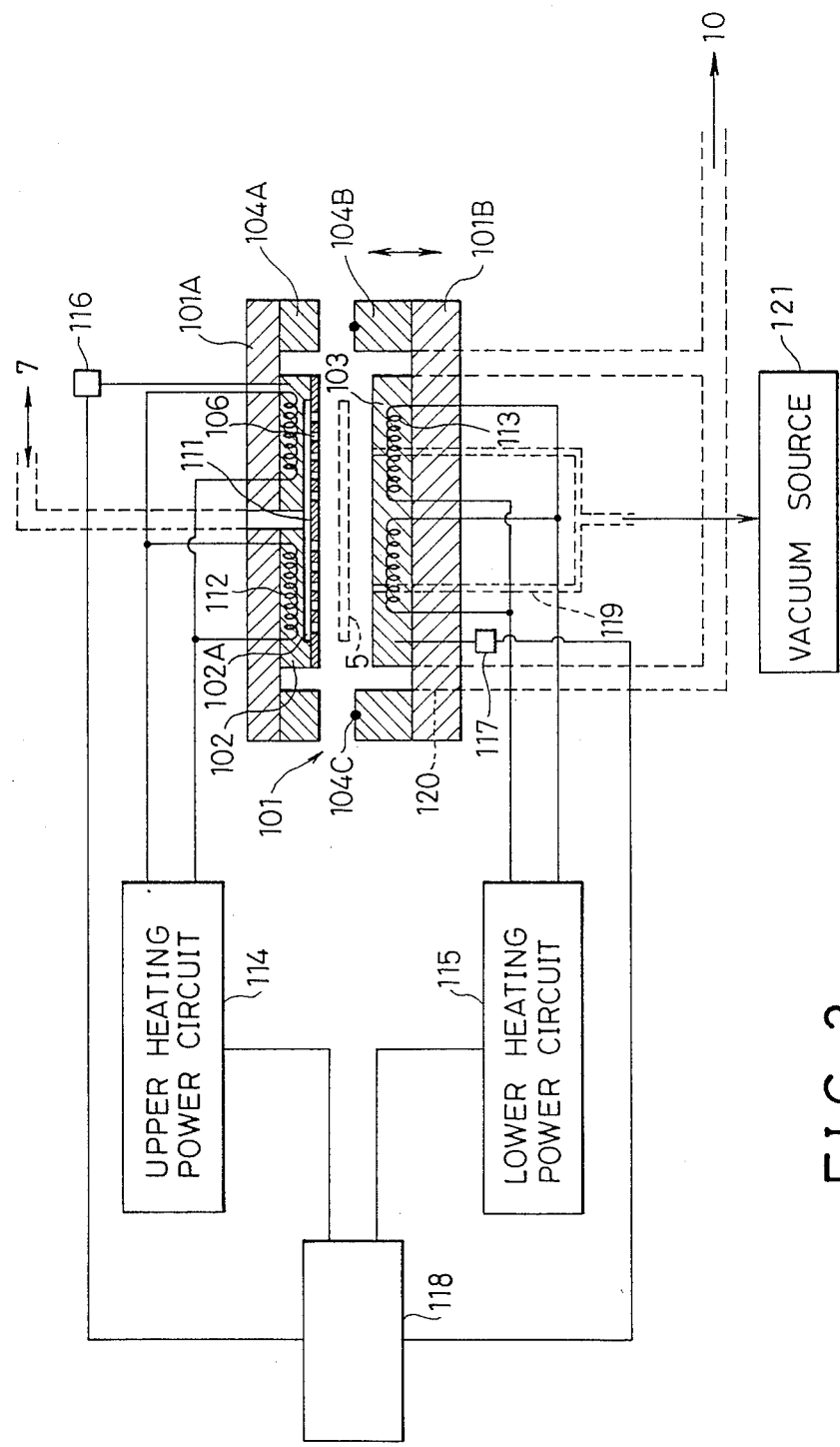
FIG. 3 is a sectional diagram showing another embodiment of a high temperature reaction processing equipment used to carry out the present invention.

Another embodiment of the reaction vessel of the high temperature reaction processing equipment used to carry out the present invention is shown in FIG. 3.

Here, a reaction vessel 101 is provided which can be separated into an upper member 101A and a lower member 101B. The upper member 101A and the lower member 101B are provided with an upper seal block 104A and a lower seal block 104B, respectively. An o-ring 104C is provided on the upper surface of the lower seal block 104B to give a tight seal. In addition, an upper heating plate 102 and a lower heating plate 103 are secured to the upper member 101A and the lower member 101B, respectively.

A disk-shaped recess 102A is formed in the bottom of the upper heating plate 102. In the same manner as shown in FIG. 2, a dispersion plate 111 is provided, penetrated by a plurality of small holes 106, to cover the recess 102A.

A heater 112 is a heater 113 are provided, embedded in the upper heating plate 102 and the lower heating plate 103, respectively. The heaters 112, 113 are connected to an upper heating power circuit 114 and a lower heating power circuit 115, respectively.

A temperature sensors 116 and 117 are embedded in the upper heating plate 102 and the lower heating plate 103, respectively. The detection signals from these sensors are input to a microcomputer 118. The microcomputer 118 controls the outputs of the upper heating power circuit 114 and the lower heating power circuit 115 to specified values.

In the same way as previously outlined, the reactive compound gas from the bubbler 7 is supplied through the small holes provided in the center section of the upper heating plate 102 and the upper member 101A, respectively. In addition, a plurality of holes 119 for chucking the substrate 5 are formed in the lower heating plate 103 and the lower member 101B, and these holes 119 are connected to a vacuum source 121. Exhaust gas holes 120 formed in the lower member 101B at the peripheral section of the lower heating plate 103 are connected to an exhaust gas system which includes a vacuum pump 10 as in the previous example.

In treating the substrate 5 by using the high temperature reaction process equipments of the configurations shown in FIG. 1 to FIG. 3, if, for example, the polymer film is a radiation-sensitive resin, the substrate 5 after the latent image of the circuit pattern has been formed thereon by radiation, is mounted on the lower heating plate 3 or 103 of the reaction vessel 1 or 101, and the reaction vessel 1 or 101 is tightly sealed by raising the lower member 1B or 101B of the reaction vessel. In this case, the upper heating plate 2 or 102 and the lower heating plate 3 or 103 are maintained at the specified temperatures, respectively and the surroundings of the substrate 5 are maintained in a tightly sealed condition.

In this arrangement, the surroundings of the substrate 5 are reduced to a vaccum of about 10 to 500 mmHg by means of the vaccum pump 10, then using the nitrogen gas, heated to 40° to 80° C. by means of the heating device 13, as an inert carrier gas, the reactive compound gas is injected onto the polymer film on the substrate 5 through the holes 6 in the upper heating plate 2 or the holes 106 in the dispersion plate 111.

At this time, the temperatures of the upper heating plate 2 or 102 and the lower heating plate 3 or 103 are controlled as explained for the representative embodiment shown in FIG. 3.

Specifically, power is supplied to the heater 112 embedded in the upper heating plate 102 from the upper heating power circuit 114, and to the heater 113 embedded in the lower heating plate 103 from the lower heating power circuit 115. The temperatures in the upper and lower heating plates 102 and 103, heated by the heaters 112 and 113, respectively, are detected by the temperature sensors 116 and 117, respectively, and detection signals are input to the microcomputer 118. Then, the upper and lower heating power circuits 114 and 115 are controlled through feedback from the microcomputer 118, so as to maintain the upper heating plate 102 and the lower heating plate 103 at specified temperatures, respectively.

In addition, in the above-mentioned embodiment, the reactive compound gas may be controlled to provide a regular or intermittent flow in the surroundings of the substrate 5. Then, at a stage where the reaction is completed the high temperature reactive compound gas is fed to the condenser 11 by the vacuum pump 10, cooled, and recovered in the trap 12.

In the above embodiment, the heating plates 2 or 102 and 3 or 103 are positioned in the reaction vessel 1 or 101 to heat the substrate 5, but in order to improve the productivity it is also acceptable to heat the substrate 5 before it is inserted into the reaction vessel 1.

In addition, it is also possible to apply the process of this invention to an amino compound treatment in the image reversal process which is capable of fine processing by performing the amine compound treatment on a substrate on which a radiation-sensitive resin layer treated by radiation is formed, and further by carrying out developing process using a strong alkali solution. Here, ammonia, trimethyl amine, triethyl amine, and the like can be given as examples of an amine compound.

EXAMPLE 1

A partially esterified material of 6-diazo-5,6-dihydro-5-oxo-1-naphthalene sulfonic acid chloride and novolak resin was applied by spincoating to a silicon wafer with a initial thickness of 0.9 $\mu$m to form a polymer film and exposed to radiation using a g-line stepper with a numerical aperture of 0.45. Next, the silicon wafer was placed in a reaction vessel of the type shown in FIG. 1 (inner volume, 340 ml) having a stainless steel upper heating plate containing a plurality of 1 to 2 mm diameter small holes and a stainless steel lower heating plate. Hexamethyl disilazane (HMDS) (bubbler temperature; 50° C., nitrogen flow rate; 1 l/min) was introduced into the reaction vessel, after which the vessel was tightly sealed and the polymer film was silylated for 3 minutes at a total pressure of 760 mmHg, an HMDS concentration of 6.6 vol.%, upper heating plate temperature $TU=90°$ C., and lower heating plate temperature $TL=150°$ C.

Using ARIES magnetron reactive ion etching equipment manufactured by the MRC Co., etching was carried out with oxygen plasma. 0.5 $\mu$m ruled lines and spaces patterns were formed on the wafer with designed dimensions.

COMPARATIVE EXAMPLES 1 & 2

A partially esterified material of 6-diazo-5,6-dihydro-5-oxo-1-naphthalene sulfonic acid chloride and novolak resin was spun onto a silicon wafer to form a polymer film and exposed to radiation using a g-line stepper with a numerical aperture of 0.45. Next, the silicon wafer was placed in the reaction vessel with a stainless steel upper heating plate containing a plurality of 1 to 2 mm diameter small holes and a stainless steel lower heating plate. Hexamethyl disilasane (HMDS) (bubbler temperature; 50° C., nitrogen flow rate; 1 l/min) was introduced into the reaction vessel, after which the vessel was tightly sealed and the polymer film was silylated for 3 minutes at a total pressure of 760 mmHg, an HMDS concentration of 6.6 vol.%, lower heating plate temperature TL=150° C., upper heating plate temperature TU=50° C. (Comparative Example 1), and TU=140° C. (Comparative Example 2).

Using ARIES magnetron reactive ion etching equipment manufactured by the MRC CO., etching was carried out in oxygen plasma. As a result, 0.5 μm ruled lines and spaces patterns meeting designed dimensions were not found to have been formed on the wafer.

The invention has been described in detail with respect to preferred embodiments, and it will now be apparent from the foregoing to those skilled in the art that changes and modifications may be made without departing from the invention in its broader aspects, and it is the invention, therefore, in the appended claims to cover all such changes and modifications as fall within the true spirit of the invention.

What is claimed is:

1. In a method for high temperature reaction process for the treatment of a polymer film on a substrate with a reactive compound, using a reaction vessel capable of being tightly sealed and equipped with an upper heating plate positioned above said substrate, and a lower heating plate positioned below said substrate, both heating plates being designed to heat said substrate, said method for high temperature reaction process being performed with a temperature difference between a temperature TU° C. of said upper heating plate and a temperature TL° C. of said lower heating plate being maintained so that TU° C. falls in the range of (TL−70) to (TL−30) °C. during the treatment.

2. The method according to claim 1 wherein the distance beween said upper heating plate and said substrate is larger than the distance between said lower heating plate and said substrate.

3. The method according to claim 1 wherein said lower heating plate is in contact with said substrate.

4. The method according to claim 1 wherein the distance between said upper heating plate and said substrate is 10 to 25 mm.

5. The method according to claim 1 wherein said upper and lower heating plates are made of any one of aluminum, stainless steel and hastelloy.

6. The method according to claim 1 wherein the temperature TL° C. of said lower heating plate is 70° to 250° C.

7. The method according to claim 1 wherein the temperature TU° C. of said upper heating plate is 40° to 160° C.

8. The method according to claim 1 wherein said reactive compound is introduced into said reaction vessel together with an inert carrier gas heated at 40° to 80° C.

9. The method according to claim 1 wherein said reactive compound is introduced into a reaction vessel by means of a plurality of small holes.

10. The method according to claim 1 wherein said polymer film is a radiation-sensitive resin composite comprising an alkali-soluble resin and a quinone diazide resin.

11. The method according to claim 1 wherein said reactive compound is any one of silicon compounds consisting of hexamethyl disilasane, N-trimethylsilylacetamide, N,O-bis(trimethylsilyl)acetoamide, vinyltrichlorosilane, methyltrichlorosilane, phenyltrichlorosilane, and methyltrichlorosilane.

12. A method for high temperature reaction process for the treatment of a polymer film on a substrate with a reactive compound within a reaction vessel comprising the steps of;
mounting said substrate on a lower heating plate in said reaction vessel,
sealing said reaction vessel while positioning an upper heating plate in said reaction vessel to above said substrate,
maintaining a temperature of said lower heating plate at TL° C. while maintaining a temperature TU° C. of said upper heating plate at (TL−70) °C. to (TL−30) °C.,
supplying said reactive compound into said reaction vessel.

13. The method according to claim 12 further comprising the step of;
preheating said substrate at predetermined temperature before mounting said substrate on a said lower heating plate in said reaction vessel.

* * * * *